(12) United States Patent
Matsubara

(10) Patent No.: US 7,567,114 B2
(45) Date of Patent: Jul. 28, 2009

(54) SEMICONDUCTOR DEVICE HAVING TWO FUSES IN PARALLEL

(75) Inventor: Yasushi Matsubara, Tokyo (JP)

(73) Assignee: Elpida Memory, Inc., Tokyo (JP)

( * ) Notice: Subject to any disclaimer, the term of this patent is extended or adjusted under 35 U.S.C. 154(b) by 89 days.

(21) Appl. No.: 11/584,582

(22) Filed: Oct. 23, 2006

(65) Prior Publication Data

US 2007/0091662 A1    Apr. 26, 2007

(30) Foreign Application Priority Data

Oct. 24, 2005   (JP)   ............................. 2005-308572

(51) Int. Cl.
*H01H 37/76*   (2006.01)
*H01H 85/00*   (2006.01)
(52) U.S. Cl. ........................ 327/525; 365/96; 365/225.7
(58) Field of Classification Search ................. 327/525; 365/96, 225.7
See application file for complete search history.

(56) References Cited

U.S. PATENT DOCUMENTS

| | | | | | |
|---|---|---|---|---|---|
| 5,200,652 | A | * | 4/1993 | Lee | 326/47 |
| 5,838,625 | A | * | 11/1998 | Cutter et al. | 365/225.7 |
| 5,886,392 | A | * | 3/1999 | Schuegraf | 257/530 |
| 6,115,283 | A | * | 9/2000 | Hidaka | 365/149 |
| 6,188,092 | B1 | * | 2/2001 | Hatano et al. | 257/229 |
| 6,469,923 | B1 | * | 10/2002 | Hidaka | 365/149 |
| 6,567,333 | B2 | * | 5/2003 | Toda | 365/225.7 |
| 6,628,561 | B2 | * | 9/2003 | Van De Graaff | 365/225.7 |
| 6,642,602 | B2 | * | 11/2003 | Lehmann et al. | 257/530 |
| 6,788,587 | B2 | * | 9/2004 | Van De Graaff | 365/189.05 |
| 6,803,804 | B2 | * | 10/2004 | Madurawe | 327/525 |
| 7,349,281 | B2 | * | 3/2008 | Kouchi et al. | 365/225.7 |
| 7,394,637 | B2 | * | 7/2008 | Lin et al. | 361/104 |
| 7,394,713 | B2 | * | 7/2008 | Knopf et al. | 365/225.7 |
| 7,436,729 | B2 | * | 10/2008 | Yoshida et al. | 365/225.7 |
| 2008/0062738 | A1 | * | 3/2008 | Schamberger et al. | 365/96 |

FOREIGN PATENT DOCUMENTS

| | | | |
|---|---|---|---|
| JP | 2000132992 A | * | 5/2000 |
| JP | 2004-178674 | | 6/2004 |

* cited by examiner

*Primary Examiner*—Lincoln Donovan
*Assistant Examiner*—Patrick O'Neill
(74) *Attorney, Agent, or Firm*—McGinn IP Law Group, PLLC

(57) ABSTRACT

A semiconductor device employs two electric fuses (31, 32) connected in parallel to each other. First terminals of the electric fuses (31, 32) are connected to a junction of first and second P-channel transistors (21, 22), which are connected in series between a high potential application line (111) and a ground, and connected to a third P-channel transistor (23). Second terminals of the electric fuses (31, 32) are connected to a low potential application line (121). When an extra-high voltage is applied between the first and second terminals of the electric fuses (31, 32), a breakdown connection is produced in at least one of the electric fuses (31, 32). Thus, 1-bit information is written into the semiconductor device.

6 Claims, 7 Drawing Sheets

SEMICONDUCTOR DEVICE HAVING TWO FUSES IN PARALLEL

This application claims priority to prior Japanese application JP 2005-308572, the disclosure of which is incorporated herein by reference.

BACKGROUND OF THE INVENTION

The present invention relates to a semiconductor device, and more particularly to a semiconductor device for storing information with use of a change of a state of an electric fuse employing a breakdown of an oxide film.

A conventional semiconductor device has an electric fuse to store 1-bit information. The electric fuse is an element employing a breakdown of an oxide film. When the oxide film is in a normal state, the electric fuse has an extremely high resistance between terminals thereof. On the other hand, when the oxide film is broken down, the electric fuse has a relatively low resistance between the terminals. The breakdown of the oxide film is made by applying a predetermined high voltage between the terminals of the electric fuse. The conventional semiconductor device is configured so as to provide different outputs according to the state of the electric fuse. Thus, the conventional semiconductor device can store 1-bit information according to the resistance of the electric fuse. In the conventional semiconductor device, the electric fuse as described above may also be referred to as an antifuse.

The conventional semiconductor device is frequently materialized as a semiconductor memory and utilized to generate a relief address when a defective cell exists. For example, such a semiconductor memory is disclosed in Japanese laid-open patent publication No. 2004-178674.

As described above, the state of the electric fuse is changed by the predetermined high voltage. However, even if the predetermined high voltage is applied to the electric fuse in the conventional semiconductor device, no breakdown connection may be produced in the electric fuse because of process variations thereof. Accordingly, malfunction of operation may be caused in the conventional semiconductor device.

SUMMARY OF THE INVENTION

It is, therefore, an object of the present invention to provide a semiconductor device capable of substantially eliminating malfunction of operation which would be caused by process variations of an electric fuse portion.

According to an aspect of the present invention, there is provided a semiconductor device including an electric fuse portion capable of providing different outputs used for storing 1-bit information. The electric fuse portion has a plurality of electric fuses each capable of irreversibly changing from a first state to a second state when a voltage higher than a predetermined value is applied thereto. The electric fuse portion is configured to provide a first output when all of the electric fuses are in the first state and a second output different from the first output when at least one of the electric fuses is in the second state.

Specifically, the electric fuse portion may have two electric fuses. The two electric fuses may be connected in parallel to each other. Alternatively, the semiconductor device may include drivers operable to provide a high potential to two electric fuses, respectively, and configured to conduct OR operation on outputs obtained according to states of the electric fuses.

According to the aspect of the present invention, the semiconductor device employs a plurality of electric fuses for an electric fuse portion. A predetermined output can be obtained if a breakdown connection is produced in any one of the electric fuses. Accordingly, malfunction of operation which would be caused by process variations of electric fuses can substantially be eliminated.

The above and other objects, features, and advantages of the present invention will be apparent from the following description when taken in conjunction with the accompanying drawings which illustrate preferred embodiments of the present invention by way of example.

DESCRIPTION OF THE PREFERRED EMBODIMENTS

A conventional semiconductor device will be described with reference to FIGS. 1 and 2 for a better understanding of this invention. Technology of storing information with use of a change of a state of an electric fuse is most frequently used for a redundancy of a semiconductor storage device. Accordingly, a storage device will be described as an example of a semiconductor device.

Figure 1:
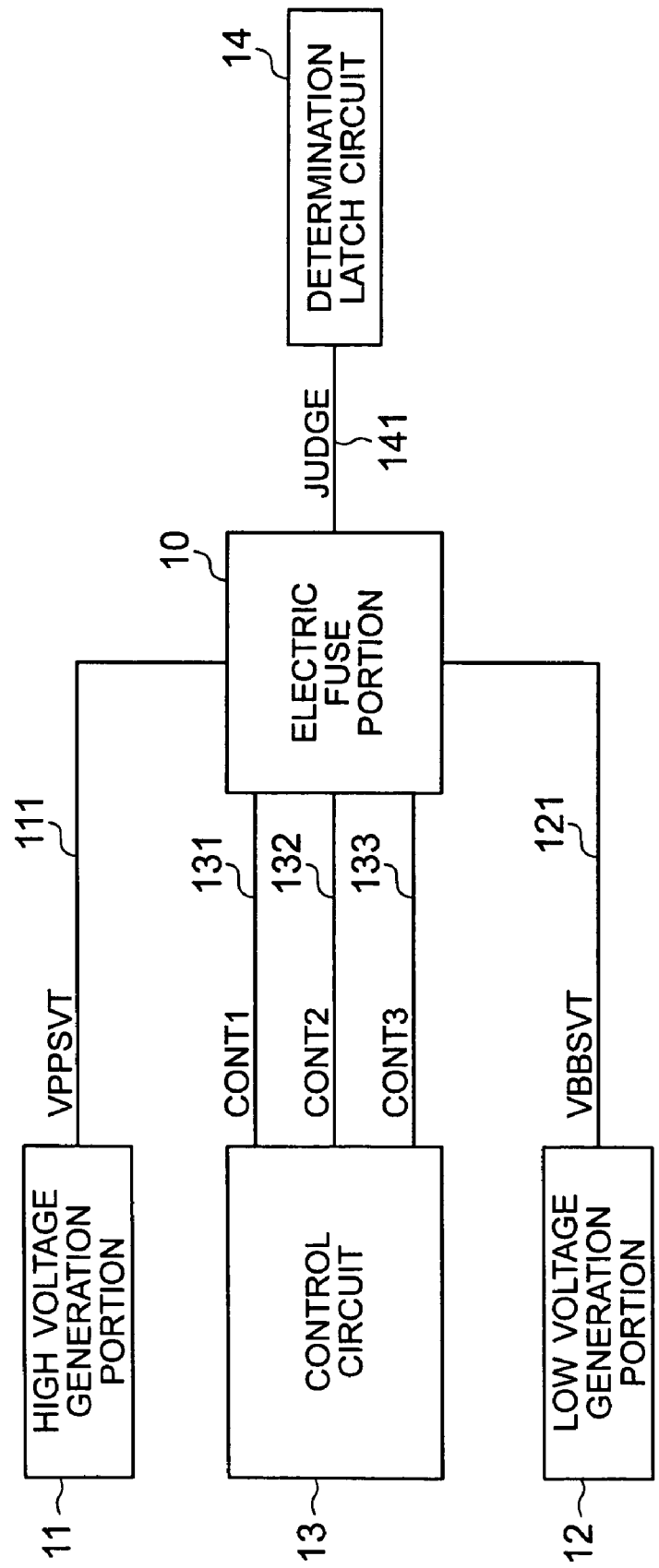
FIG. 1 is a block diagram showing an arrangement of a conventional storage device.

FIG. 1 is a block diagram showing an entire arrangement of a conventional storage device. The illustrated storage device is a semiconductor storage device formed on a single semiconductor chip. The storage device has an electric fuse portion 10 as a primary part, a high voltage generation portion 11, a low voltage generation portion 12, a control circuit 13, and a determination latch circuit 14.

The high voltage generation portion 11, the low voltage generation portion 12, the control circuit 13, and the determination latch circuit 14 are connected to the electric fuse portion 10 via a high potential application line 111, a low potential application line 121, control signal lines 131 to 133, and an output line 141, respectively.

The high voltage generation portion 11 is operable to selectively generate a higher power source voltage VDD or an extra-high voltage that is extremely higher than the power source voltage VDD and supply the generated voltage of a higher power source voltage level VPPSVT via the high potential application line 111 to the electric fuse portion 10.

The low voltage generation portion 12 is operable to supply a lower power source voltage VSS of a lower power source voltage level VBBSVT via the low potential application line 121 to the electric fuse portion 10.

The control circuit 13 is operable to generate first, second, third control signals CONT1, CONT2, and CONT3 and supply the first, second, and third control signals CONT1, CONT2, and CONT3 via the control signal lines 131, 132, and 133 to the electric fuse portion 10, respectively.

The electric fuse portion 10 is operable to supply an output JUDGE via the output line 141 to the determination latch circuit 14, where the output JUDGE is latched.

Figure 2:
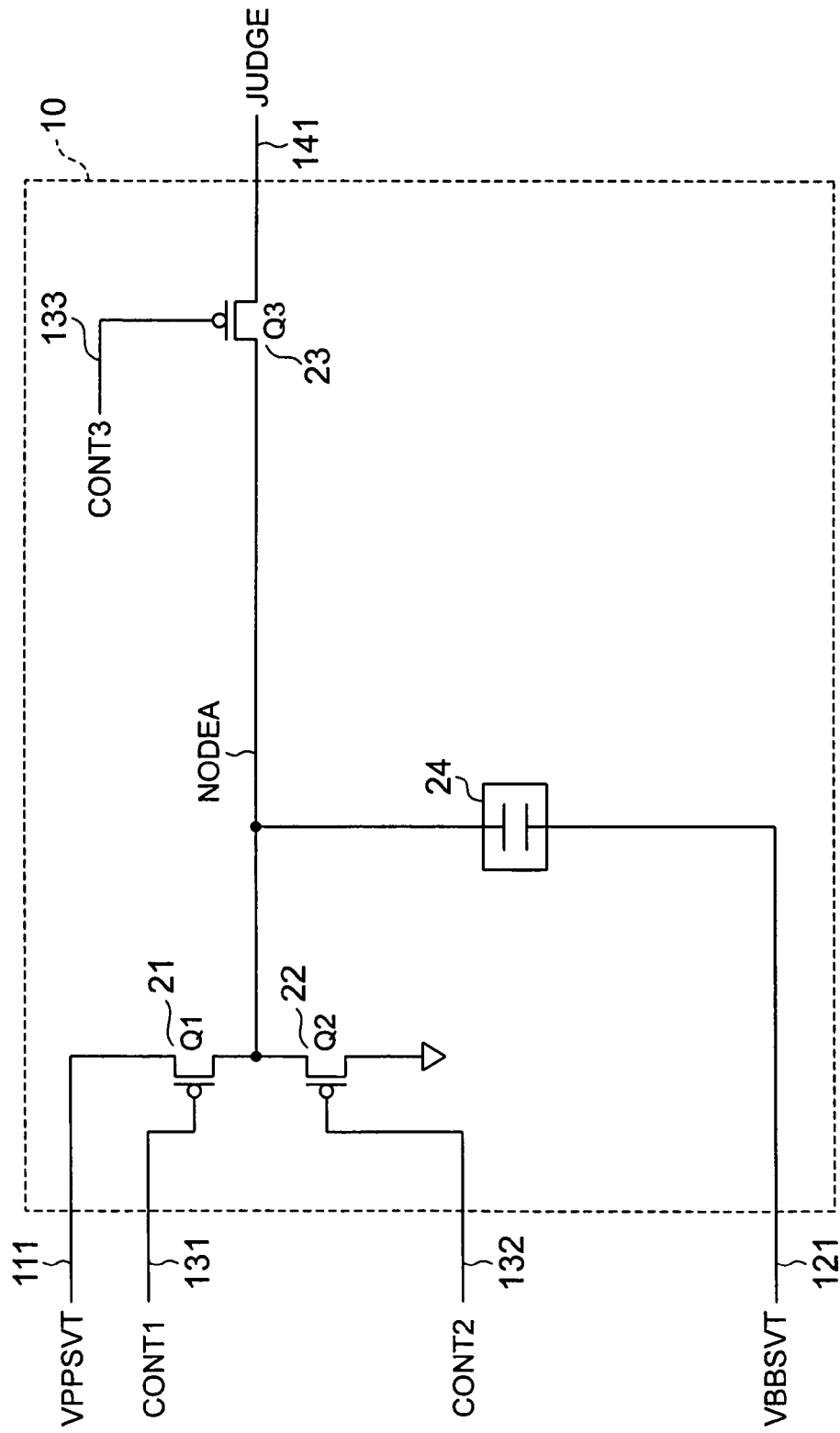
FIG. 2 is a circuit diagram showing an arrangement of an electric fuse portion used in the storage device shown in FIG. 1.

FIG. 2 is a circuit diagram showing an arrangement of the electric fuse portion 10 used in the storage device shown in FIG. 1.

Referring to FIG. 2, the electric fuse portion 10 has a pair of P-channel transistors (Q1) 21 and (Q2) 22 connected in series between the high potential application line 111 and a ground, a P-channel transistor (Q3) 23 connected between a junction of these transistors 21 and 22 and the output line 141, and an electric fuse 24 having a first terminal connected between the transistor 23 and the junction of the transistors 21 and 22 and a second terminal connected to the low potential application line 121.

The transistors 21 and 22 serve as a driver for operating the electric fuse 24. The transistor 23 serves as a switch for disconnecting the electric fuse 24 from the output.

For example, the electric fuse 24 is formed of an N-channel MOS transistor or a capacitive element. When an N-channel MOS transistor is used to form the electric fuse 24, a source node and a drain node of the N-channel MOS transistor are short-circuited to form a node, which is used as one terminal of the electric fuse 24. A gate node of the N-channel MOS transistor is used as another terminal of the electric fuse 24. When a capacitive element is used to form the electric fuse 24, an element that produces a breakdown connection when a high voltage is applied to opposite terminals of the element is used as the capacitive element. Specifically, an element having a dielectric film of an oxide film is used as the capacitive element. At any rate, the electric fuse 24 is an element employing a breakdown of an oxide film.

Next, operation of the conventional storage device will be described.

This storage device stores 1-bit information with use of the fact that the output JUDGE varies according to a state (resistance) of the electric fuse 24. Specifically, a state in which the electric fuse 24 has a high resistance between its terminals is assigned to a logic "0" (or "1") while a state in which the electric fuse 24 has a low resistance between its terminals is assigned to a logic "1" (or "0"). Thus, the storage device stores 1-bit information.

At an initial state, the electric fuse 24 has an extremely high resistance between its terminals such that the electric fuse 24 can be considered to be an insulator. Then, when a voltage higher than a predetermined value is applied between the terminals of the electric fuse 24, an oxide film of the electric fuse 24 is broken down so that the terminals of the electric fuse 24 are electrically connected to each other (breakdown connection). Thus, the electric fuse 24 gets to have a relatively low resistance.

In a case where the electric fuse 24 is formed by an N-channel MOS transistor, a capacity is formed such that a gate oxide film serves as a dielectric layer. When a high voltage is applied between source and drain nodes and a gate node, a high electric field is applied to the gate oxide film. Thus, a leak current flowing through the gate oxide film is generated and increased so as to cause a breakdown. Specifically, the gate oxide film is broken down so as to form a current path therein. As a result, a resistance between terminals of the electric fuse 24 is reduced from an extremely high value (first state) at which the electric fuse 24 can be considered to be an insulator to a value (second state) ranging from several hundreds of kilo-ohms to several hundreds of ohms. In order to sufficiently reduce a resistance of the electric fuse 24, it is necessary to sufficiently increase an applied voltage and sufficiently lengthen a period of time for application.

When information is to be stored in (or written into) the storage device, a high voltage is applied between the terminals of the electric fuse 24 so as to produce a breakdown connection, or alternatively a high resistance is maintained without application of a high voltage.

A breakdown connection is produced in the electric fuse 24 as follows.

First, the control signals CONT2 and CONT3 are set to be a high level so that the transistors 22 and 23 are in an off-state while the control signal CONT1 is set to be a low level so that the transistor 21 is in an on-state. At that time, an extra-high potential extremely higher than the power source potential VDD is applied as the higher power source voltage level VPPSVT while a voltage lower than a ground level is applied as the lower power source voltage level VBBSVT. Thus, a high voltage is applied between the terminals of the electric fuse 24 so as to break down an oxide film in the electric fuse 24. As a result, a resistance of the electric fuse 24 is lowered. In this manner, information corresponding to a logic "0" or "1" is recorded by the fact that the electric fuse 24 gets to have a lowered resistance.

Next, operation of reading information from the storage device will be described.

The control signals CONT1, CONT2, and CONT3 are set to be a low level, a high level, and a low level, respectively. Thus, the transistor 21 is turned on, the transistor 22 is turned off, and the transistor 23 is turned on. In this state, a higher power source level VDD is applied as the higher power source voltage level VPPSVT while a lower power source level VSS is applied as the lower power source voltage level VBBSVT. A potential level NODEA of one terminal of the electric fuse 24 is precharged at a power source voltage VDD level. Since the transistor 23 has been turned on, a potential level of the output JUDGE is equal to the potential level NODEA of the terminal of the electric fuse 24.

Then, the control signal CONT1 is set to be a high level so as to turn off the transistor 21. The potential level of the output JUDGE is lowered in proportion to the resistance of the electric fuse 24.

Specifically, if the electric fuse 24 maintains an extremely high resistance without a breakdown connection, then the potential level of the output JUDGE is not lowered even after a predetermined period of time (e.g., several nanoseconds) and is maintained at the precharged level. If the electric fuse 24 has a relatively low resistance due to a breakdown connection, the potential level of the output JUDGE is greatly lowered from the precharged level to the lower power source level. Accordingly, information stored in the storage device can be read by detecting whether or not the potential level of the output JUDGE is at the precharged level or at a sufficiently low level after a predetermined period of time from the disconnection of the transistor 21.

The determination latch circuit 14 is operable to detect the potential level of the output JUDGE after a predetermined period of time from the disconnection of the transistor 21 and to latch the result of the detection. The determination latch circuit 14 may be formed by a simple inverter circuit or a circuit employing a differential amplifier.

As described above, the conventional storage device is configured to provide different outputs according to a state of the electric fuse. Thus, the conventional storage device can store 1-bit information.

Figure 3:
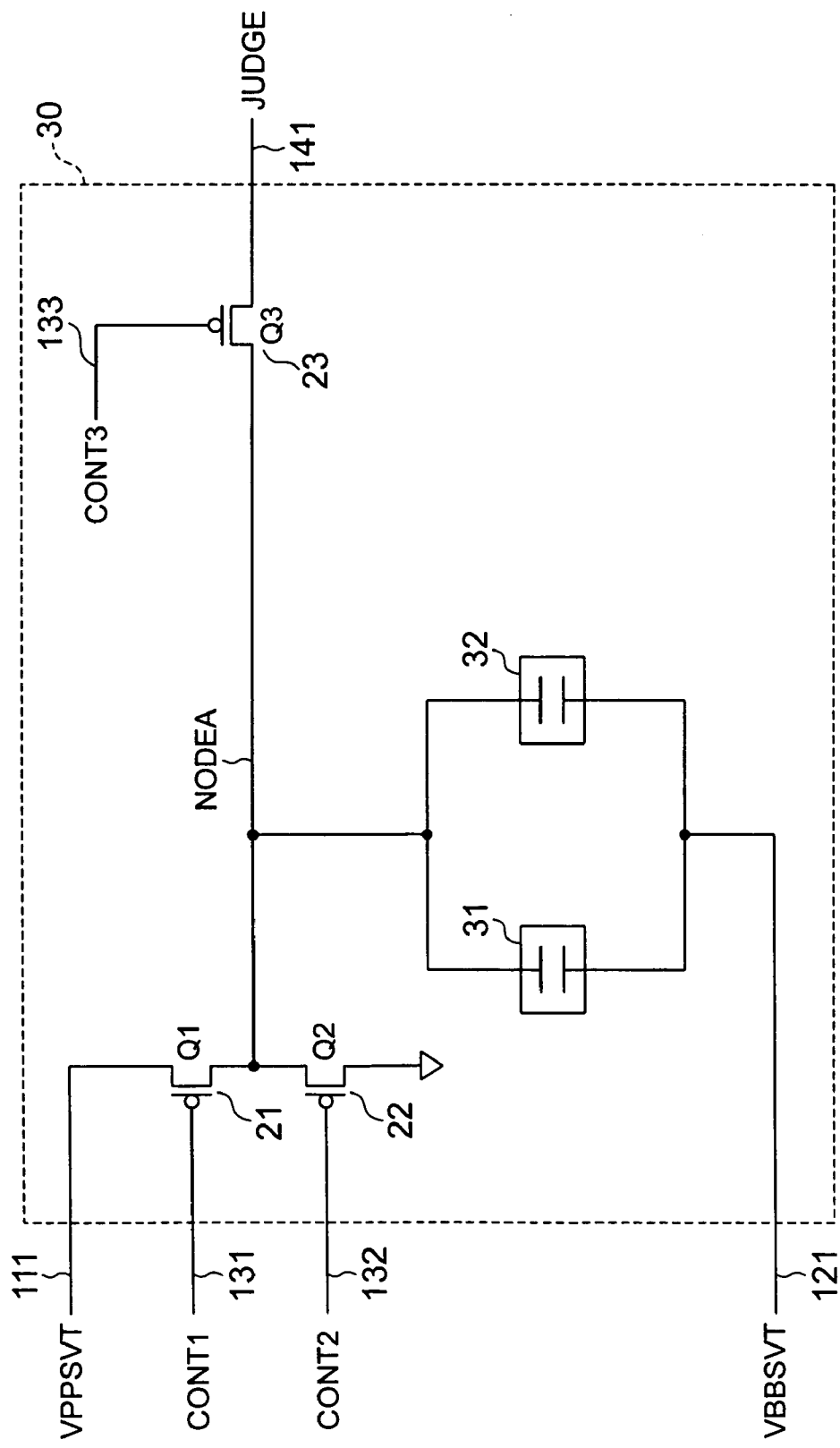
FIG. 3 is a circuit diagram showing an arrangement of an electric fuse portion used in a storage device according to a first embodiment of the present invention.

Referring to FIG. 3, a semiconductor device according to a first embodiment of the present invention will be described below.

FIG. 3 is a circuit diagram showing an arrangement of an electric fuse portion (parallel electric fuse portion) 30 used in a storage device according to a first embodiment of the present invention. A main part of the storage device has the same arrangement as that of the conventional storage device shown in FIG. 1.

The electric fuse portion 30 shown in FIG. 3 differs from the conventional electric fuse portion 10 in that two electric fuses 31 and 32 are connected in parallel to each other. These electric fuses 31 and 32 are formed so as to have the same characteristics.

Operation of the electric fuse portion 30 shown in FIG. 3 is basically the same as that of the conventional electric fuse portion 10. However, there is a difference in breakdown connection of the electric fuses 31 and 32. This difference will be described below.

Since the electric fuses 31 and 32 are connected in parallel to each other, the same voltage is applied between the terminals of the electric fuse 31 and between the terminals of the electric fuse 32. Further, as described above, the electric fuses 31 and 32 have the same characteristics. Accordingly, when an extra-high voltage high enough to produce a breakdown connection is applied between the terminals of the electric fuses 31 and 32, a breakdown connection is theoretically produced in both of the electric fuses 31 and 32.

Practically, however, breakdown connection of the electric fuses 31 and 32 does not necessarily proceed concurrently. Thus, one may precede the other. In such a case, as a resistance is reduced in the electric fuse 31 or 32 in which a breakdown connection precedes, a current flowing through that electric fuse is increased. As a result, a voltage between the terminals of the electric fuses 31 and 32 is slightly reduced. The reduction of the voltage between the terminals of the electric fuses 31 and 32 stops the progress of a delayed breakdown connection in the other electric fuse 32 or 31. Alternatively, no breakdown connection may be produced in the other electric fuse 32 or 31. As a matter of course, in spite of the reduction of the voltage between the terminals of the electric fuse 31 or 32, a breakdown connection may not be stopped in the electric fuse 31 or 32 and may be continued in both of the electric fuses 31 and 32.

Accordingly, in the electric fuse portion 30 of the present embodiment, when a potential level NODEA of the first terminals of the electric fuses 31 and 32 is increased to an extra-high potential, a breakdown connection may be produced in one of the following three manners: 1) A breakdown connection is produced in the electric fuse 31. 2) A breakdown connection is produced in the electric fuse 32. 3) A breakdown connection is produced in both of the electric fuses 31 and 32. In other words, when an extra-high voltage is applied between the first and second terminals of the electric fuses 31 and 32, a breakdown connection is produced in at least one of the electric fuses 31 and 32.

If a breakdown connection is produced in at least one of the electric fuses 31 and 32, then a precharged potential level of the output JUDGE is largely lowered before a predetermined period of time after the transistor 21 is turned off. Accordingly, the storage device using the electric fuse portion 30 shown in FIG. 3 can also store 1-bit information as with the conventional storage device.

Effects caused by parallel connection of the two electric fuses 31 and 32 will be described below.

Figure 4:
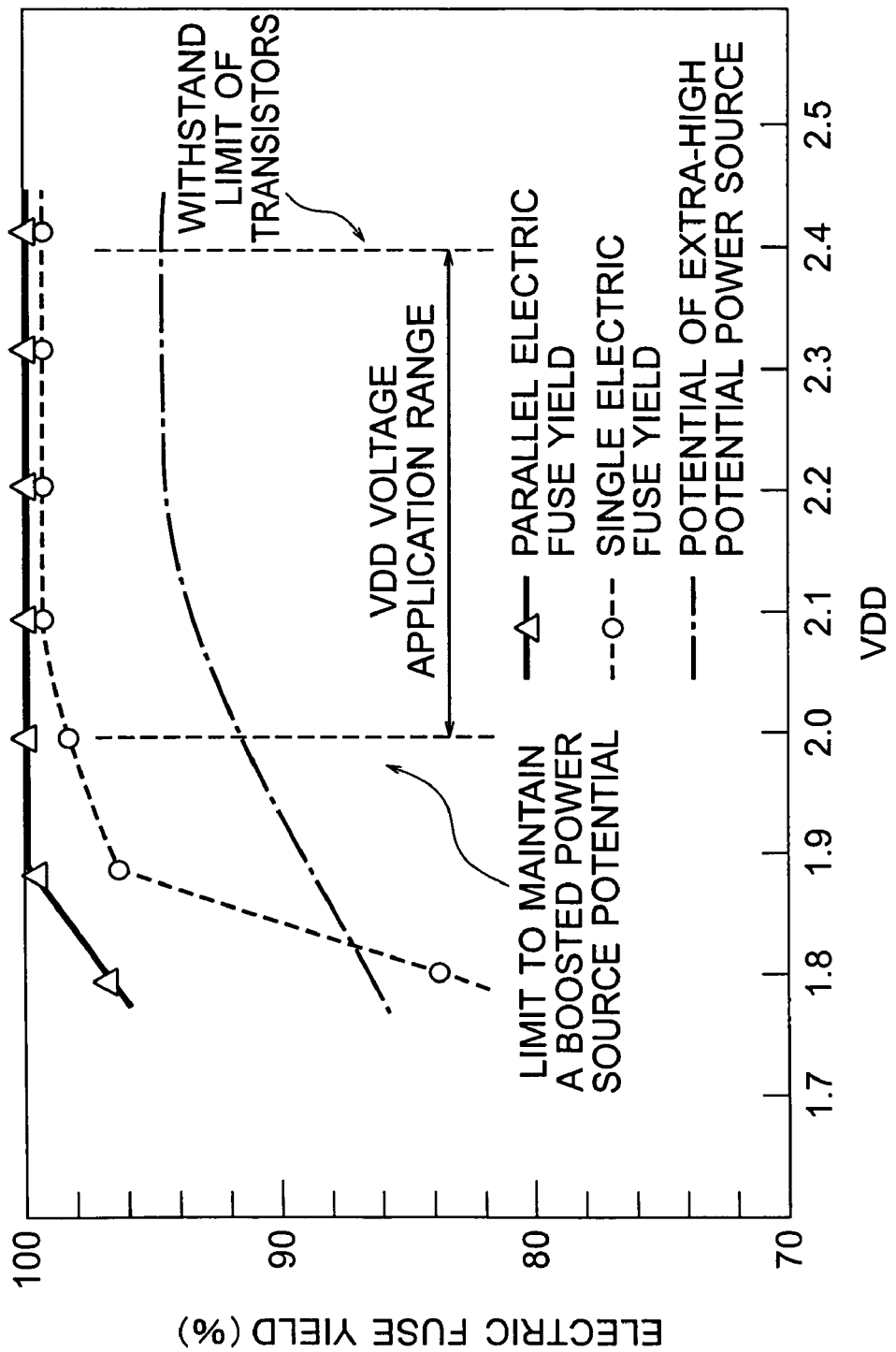
FIG. 4 is a graph explanatory of effects of the electric fuse portion shown in FIG. 3.

An extra-high potential high enough to produce a breakdown connection in the electric fuses 31 and 32 is generated by a high potential generation portion (11 in FIG. 1). The high potential generation portion includes a pumping circuit (not shown), which boosts a power source voltage VDD to generate an extra-high potential. In FIG. 4, a chain line represents a relationship between a power source voltage VDD supplied to the pumping circuit and a resultant extra-high potential.

As shown in FIG. 4, in a case where the power source voltage VDD is relatively low, the extra-high potential generated by the pumping circuit is in proportion to the power source voltage VDD. The graph in FIG. 4 shows that a lower limit of the power source voltage VDD required to obtain an extra-high potential required to produce a breakdown connection in the electric fuses 31 and 32 is about 2.0 V.

Meanwhile, an extra-high potential generated by the pumping circuit becomes saturated in a case where the power source voltage VDD is relatively high. This phenomenon is caused by a leak current generated due to characteristics of the pumping circuit and withstand limits of various transistors to which an extra-high potential is applied. Accordingly, it is nonsense to excessively increase the power source voltage VDD. Further, the extra-high potential is also applied to the transistors 11, 12, and 13, which are control transistors. Therefore, it is necessary to prevent oxide films or the like in the transistors 11, 12, and 13 from being broken down by an applied electric field. Thus, an upper limit of the power source voltage VDD is about 2.4 V.

From the above discussion, in the present embodiment, an appropriate range of the power source potential VDD is from about 2.0 V to about 2.4 V.

In FIG. 4, a dashed line represents a relationship between a power source potential VDD and a yield (success rate) in a case where an extra-high potential was generated from the power source potential VDD and applied to a conventional electric fuse portion so as to produce a breakdown connection therein. Further, a solid line represents a relationship between a power source potential VDD and a yield (success rate) when an extra-high potential was generated from the power source potential VDD and applied to the electric fuse portion according to the present embodiment so as to produce a breakdown connection therein.

The graph shown in FIG. 4 is based on results of experiments conducted with use of about 100 to 1000 electric fuse portions for each power source potential VDD value. The yield was calculated from the results of the experiments according to a formula of (the number of electric fuse portions successfully broken down)/(the number of all electric fuse portions used in each experiment). With regard to electric fuse portions according to the present embodiment, when a breakdown connection was produced in at least one of two electric fuses connected in parallel, the electric fuse portion was determined to be successfully broken down.

As is apparent from FIG. 4, when the power source potential VDD was in a range of from 2.0 V to 2.4 V, failure, or an incomplete breakdown connection of electric fuses, was caused at a rate of about 1% to about 2% in the conventional electric fuse portions. In contrast to the conventional electric fuse portions, the electric fuse portions according to the present embodiment substantially had a success rate of 100%. Assuming that each electric fuse had a success rate of 98% for breakdown connection, a probability of failure of breakdown connection in both of two electric fuses connected in parallel is calculated to be 0.04% by a simple calculation (without regard to a lowered voltage between terminals and the like). Thus, a failure rate can remarkably be reduced.

These results are considered to be caused by the fact that a probability that no breakdown connection is produced in both of two electric fuses connected in parallel to each other is sufficiently low. More specifically, when breakdown connection proceeds in both of the electric fuses, a probability that the breakdown stops concurrently in both of the electric fuses is sufficiently low. Even if one of electric fuses connected in parallel is unlikely to be broken down, a probability that the other electric fuse is also unlikely to be broken down is sufficiently low.

Further, the storage device according to the present embodiment includes only one additional electric fuse as compared to the conventional storage device. A space required for the additional electric fuse is sufficiently small as compared to a space required for the entire storage device. Accordingly, in order to achieve the aforementioned remarkable reduction of a failure rate of breakdown connection, the storage device according to the present embodiment substantially has no disadvantages in space.

In the above embodiment, two electric fuses are used in an electric fuse portion. However, three or more electric fuses may be used in an electric fuse portion.

A storage device according to a second embodiment of the present invention will be described with reference to FIGS. 5 and 6.

Figure 5:
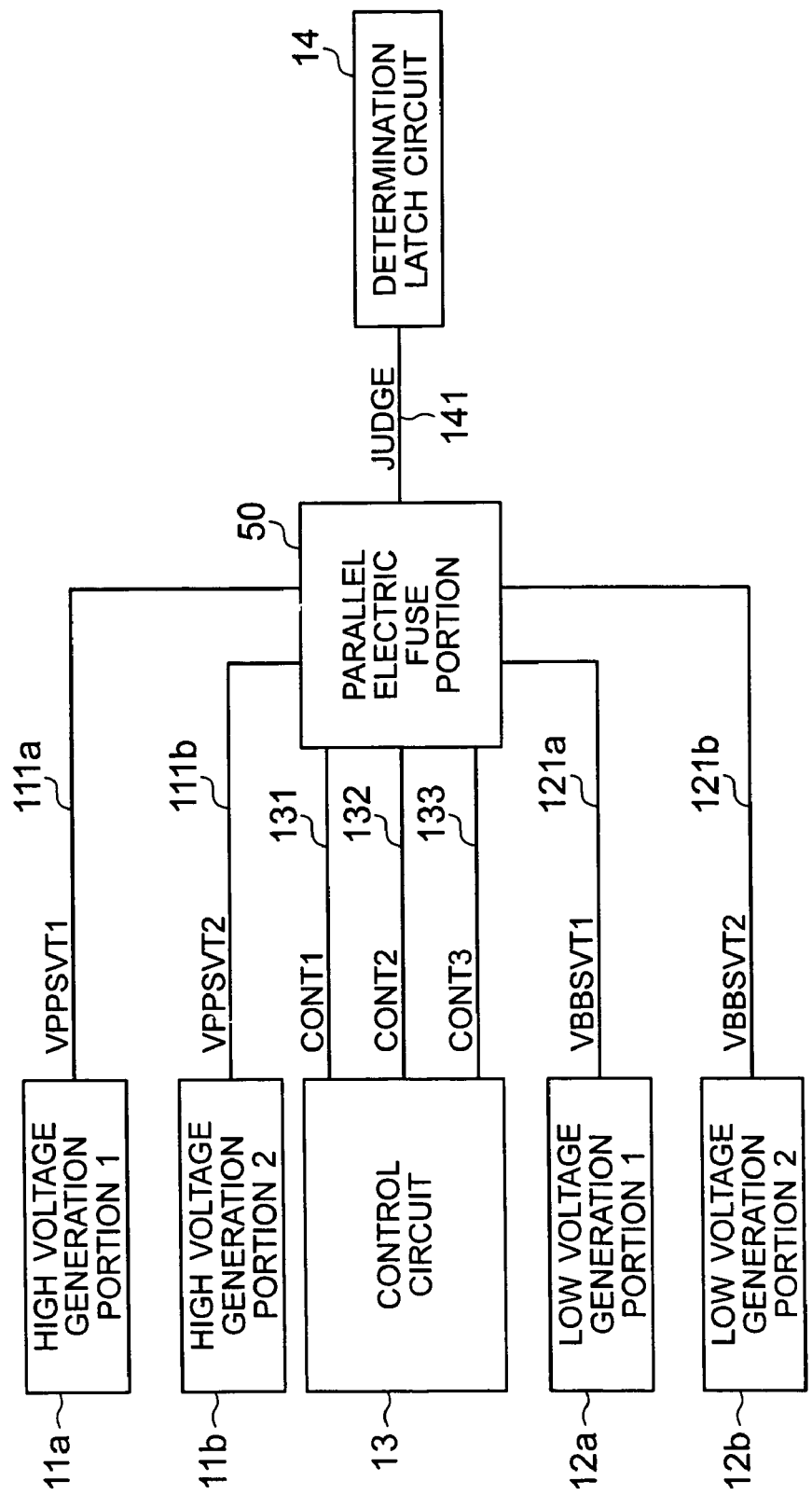
FIG. 5 is a block diagram showing an arrangement of a storage device according to a second embodiment of the present invention.

As shown in FIG. 5, the storage device in the present embodiment has two high voltage generation portions 11a and 11b and two low voltage generation portions 12a and 12b.

Each of the high voltage generation portions 11a and 11b has the same arrangement as the conventional high voltage generation portion 11. Similarly, each of the low voltage generation portions 12a and 12b has the same arrangement as the conventional low voltage generation portion 12.

The high voltage generation portions 11a and 11b are connected to an electric fuse portion (anti-parallel fuse portion) 50 via high potential application lines 111a and 111b, respectively. The low voltage generation portions 12a and 12b are connected to the electric fuse portion 50 via low potential application lines 121a and 121b, respectively.

Figure 6:
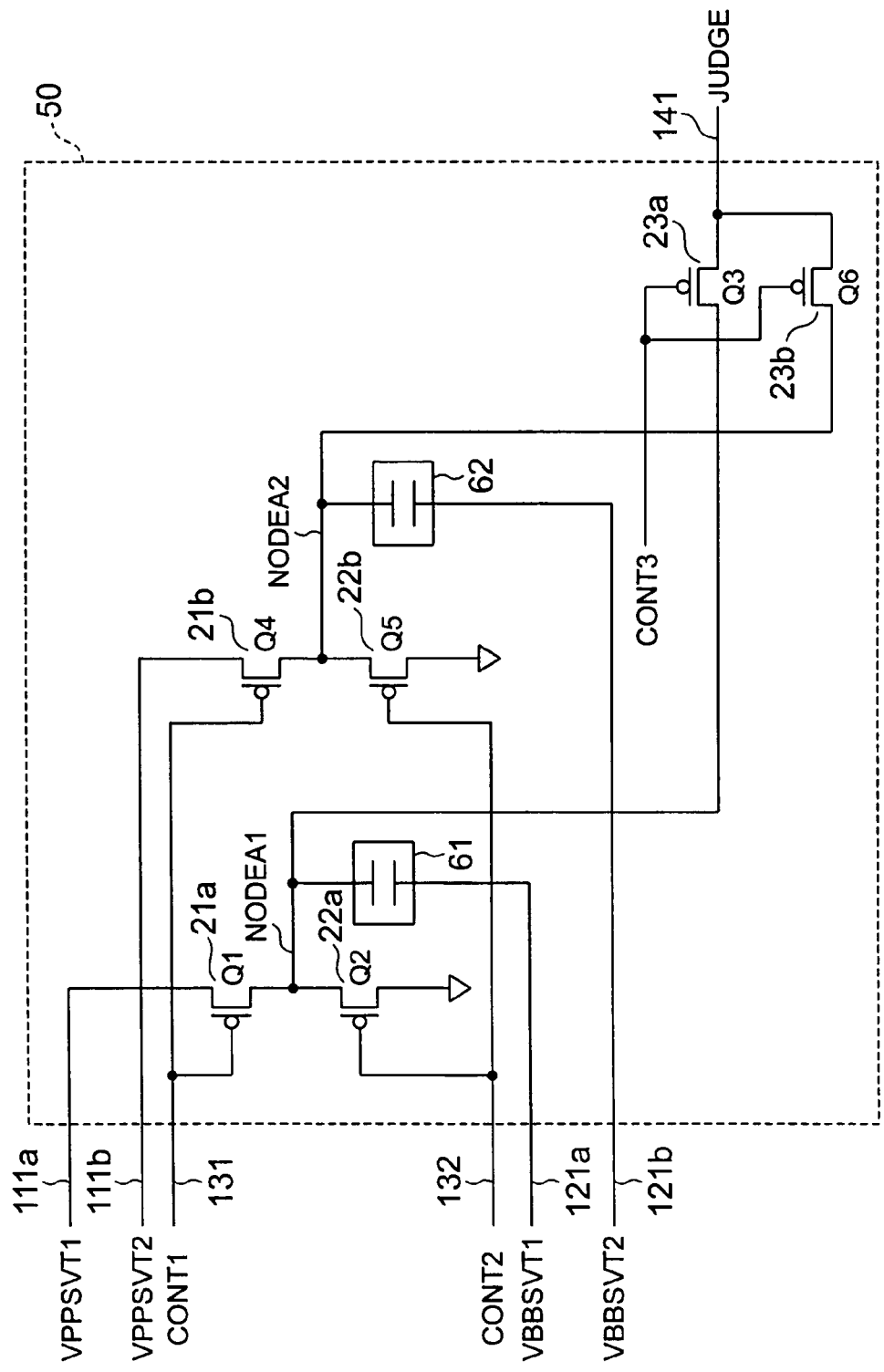
FIG. 6 is a circuit diagram showing an arrangement of an electric fuse portion used in the storage device shown in FIG. 5.

The electric fuse portion 50 used in the storage device shown in FIG. 5 is arranged as shown in FIG. 6. This arrangement is equivalent to an arrangement in which two electric fuse portions 10 shown in FIG. 2 are prepared, control signals CONT1 to CONT3 are supplied to each of the two electric fuse portions 10, and outputs of the two electric fuse portions 10 are connected to a common output line.

In the present embodiment, writing and reading of information are also conducted in a similar manner to those in the conventional storage device.

In the present embodiment, the control signal CONT1 is supplied to both of transistors 21a and 21b. The control signal CONT2 is supplied to both of transistors 22a and 22b. The control signal CONT3 is supplied to both of transistors 23a and 23b. Accordingly, operations of writing and reading are performed in parallel on electric fuses 61 and 62. In the present embodiment, the high voltage generation portion 11a and the low voltage generation portion 12a are used for providing a potential to the electric fuse 61. The high voltage generation portion 11b and the low voltage generation portion 12b are used for providing a potential to the electric fuse 62. Thus, each of the electric fuses 61 and 62 is not influenced by the other electric fuse. Specifically, in a case where an extra-high potential is applied to both of the electric fuses 61 and 62 so as to produce a breakdown connection, even if a breakdown connection precedes in one of the electric fuses 61 and 62 and lowers a voltage between its terminals, that fact does not affect a voltage between terminals of the other of the electric fuses 61 and 62. Accordingly, a breakdown connection proceeds independently in each of the electric fuses 61 and 62.

Thus, in the present embodiment, since a breakdown connection proceeds independently in each of the electric fuses 61 and 62, a success rate (yield) is enhanced as compared to that in the first embodiment.

Further, only process variations of the electric fuses 31 and 32 are considered in the first embodiment. Accordingly, if an extra-high potential high enough to produce a breakdown connection cannot be applied to the electric fuses 31 and 32 because the transistors 21, 22, and 23 have low withstand voltages, a breakdown connection cannot be produced in any of the electric fuses 31 and 32. In contrast to the first embodiment, in the second embodiment, the transistors 21a, 22a, and 23a are provided so as to correspond to the electric fuse 61, and the transistors 21b, 22b, 23b are provided so as to correspond to the electric fuse 62. Accordingly, even in consideration of a probability of production of defective transistors, the storage device in the second embodiment is advantageous as compared to the storage device in the first embodiment.

Figure 7:
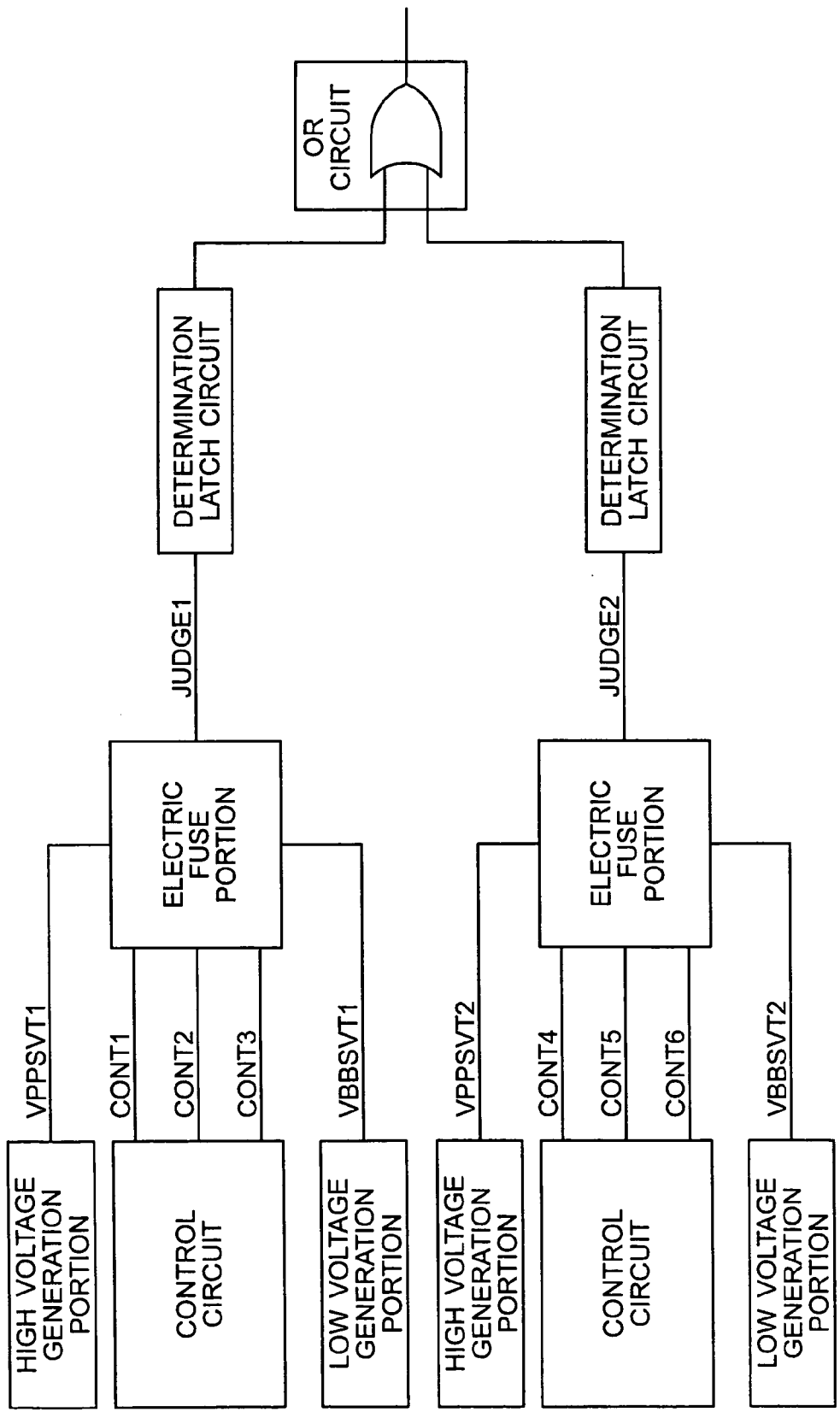
FIG. 7 is a block diagram showing a device configured to conduct OR operation on outputs of two conventional storage devices.

Since the storage device in the present embodiment has two sets of a high voltage generation portion, a low voltage generation portion, and a driver (transistors), a larger space is required for the storage device as compared to the storage device in the first embodiment. Nevertheless, the storage device in the present embodiment requires a smaller space than a storage device shown in FIG. 7, which conducts OR operation on outputs of two conventional storage circuits.

Although certain preferred embodiments of the present invention have been shown and described in detail, it should be understood that various changes and modifications may be made therein without departing from the scope of the appended claims. For example, although two high voltage generation portions and two low voltage generation portions are used in the second embodiment, one high voltage generation portion and one low voltage generation portion may be used in order to reduce a space required for the storage device.

Further, the present invention can be used not only for a redundancy of a storage device, but also for switching in an electrically writable circuit as an option selector in a semiconductor device and for a ROM for fine control or trimming of internal timing.

What is claimed is:

1. A semiconductor device including an electric fuse portion capable of providing different outputs used for storing 1-bit information, the semiconductor device comprising:
   two electric fuses provided in parallel in the electric fuse portion;
   a first driver operable to provide a first high potential to one of said two electric fuses;
   a second driver operable to provide a second high potential to another of said two electric fuses independently of said first driver; and
   a switch operable to disconnect said two electric fuses from an output of said electric fuse portion.
   wherein said two electric fuses are each capable of irreversibly changing from a first state to a second state when a voltage higher than a predetermined value is applied thereto, and
   wherein said electric fuse portion is configured to provide a first output when all of said two electric fuses are in the first state and a second output different from the first output when at least one of said two electric fuses is in the second state.

2. The semiconductor device as recited in claim 1. wherein said first driver is connected to a first power source while said second driver is connected to a second power source.

3. The semiconductor device as recited in claim 2, wherein said first driver includes a first transistor connected between said first power source and one of said two electric fUses, and
   wherein said second driver includes a second transistor connected between said second power source and the other of said two electric fuses.

4. The semiconductor device as recited in claim 3, wherein said switch includes;
   a third transistor connected between said one of said two electric fuses and said output of said electric fuse portion; and
   a fourth transistor connected between the other of said two electric fuses and said output of said electric fuse portion.

5. The semiconductor device as recited in claim 1, wherein each of said electric fuses cam prises an electric fuse employing a breakdown of an oxide film.

6. The semiconductor device as recited in claim 1, wherein said switch includes:
   a first transistor connected between said one of said two electric fuses and said output of said electric fuse portion; and
   a second transistor connected between the other of said two electric fuses and said output of said electric fuse portion.

* * * * *